NEGATIVE RESISTANCE MICROWAVE DEVICE

Filed May 16, 1966

INVENTORS: B. C. DE LOACH, JR.
H. K. GUMMEL
D. L. SCHARFETTER
BY Arthur J. Torsiglieri
ATTORNEY 3,426,295
Patented Feb. 4, 1969

3,426,295

NEGATIVE RESISTANCE MICROWAVE DEVICE

Bernard C. De Loach, Jr., Murray Hill, Hermann K. Gummel, North Plainfield, and Donald L. Scharfetter, Morristown, N.J., assignors to Bell Telephone Laboratories, Incorporated, Murray Hill, N.J., a corporation of New York Filed May 16, 1966, Ser. No. 550,547
U.S. Cl. 331—107 6 Claims
Int. Cl. H03b 5/12, 5/24, 7/06

ABSTRACT OF THE DISCLOSURE

A PININ or NIPIP semiconductive wafer is included in a cavity and used as an impact ionization avalanche transit time diode to provide a dynamic negative resistance at the resonant frequency of the cavity.

This invention relates to semiconductive devices useful for providing a dynamic negative resistance.

There is considerable interest currently in solid state microwave energy sources. Such sources promise to be more compact and less expensive, and to have considerably longer life than microwave tubes.

Among the most promising forms of solid state microwave sources is the impact ionization avalanche transit time diode described in United States Patents 2,899,646 and 2,899,652 which issued to W. T. Read, Jr., on August 11, 1959. It is characteristic of such a diode that it employs a multi-zone semiconductive element which includes an avalanche region and a drift region intermediate between cathode and anode terminal regions, and a dynamic negative resistance is achieved by introducing an appropriate transit time to avalanching carriers in their travel across the drift region. In such a diode it was deemed advantageous to utilize a semiconductive element designed to have an avalanche region short relative to the length of the drift region. Considerations of this kind led to the use of semiconductive elements having PNIP or the complementary NPIN geometry.

We have now discovered that the efficiency of such impact ionization avalanche transit time diodes can be enhanced by utilization of a semiconductive element in which the length of the avalanche region is a significant fraction of the total length between the cathode and anode regions. In particular to achieve this end, there is employed a semiconductive element having a PININ geometry (or its complement) where I is used to denote high resistivity material, and the other letters are used in the fashion usual in the semiconductor art.

In accordance with the preferred embodiment of the invention, a silicon diode having a PININ resistivity configuration is positioned in a microwave resonant cavity and a D-C voltage bias is established across the diode to establish thereacross a dynamic negative resistance at the resonant frequency of the cavity whereby there are generated in the cavity oscillations which can be abstracted for utilization. Alternatively the diode described can be employed as a negative resistance amplifier.

The invention will be better understood from the following more detailed description taken in conjunction with the accompanying drawing in which.

Figure 1:
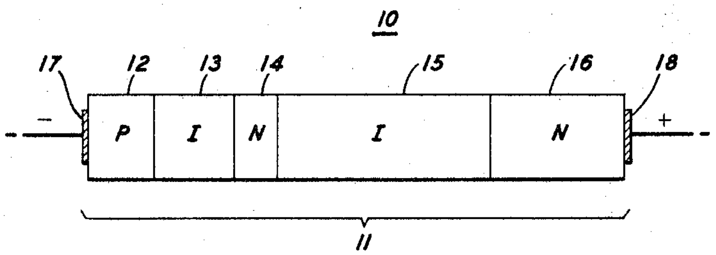
FIG. 1 shows a semiconductive diode having a PININ resistivity configuration for use in accordance with the invention and FIG. 1A shows the complementary NIPIP form.

With reference now to FIG. 1, the diode 10 comprises a monocrystalline wafer 11 having a PININ resistivity configuration made up of zones 12 through 16. Electrode connections 17 and 18 make low resistance connections to the low resistivity terminal zones 12 and 16 which may be termed the cathode and anode, respectively, of the diode. Zones 13, 14 and 15 form the active region of the diode and include the avalanche region consisting essentially of zone 13 and a portion of zone 14 and the drift region consisting essentially of the remainder of zone 14 and zone 15.

Figure 2:
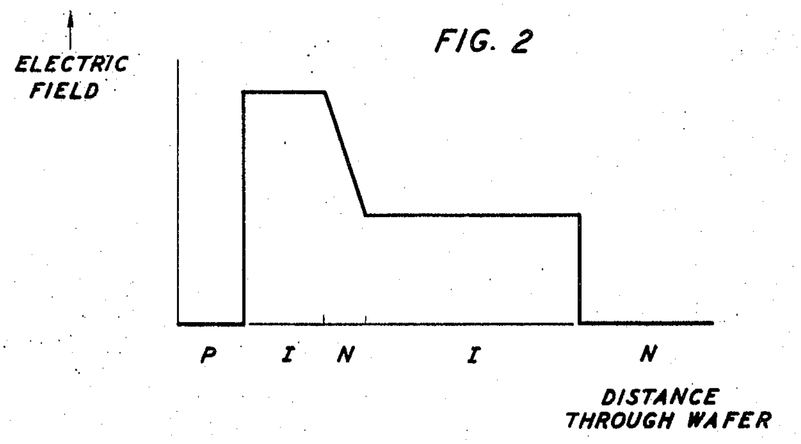
FIG. 2 shows the electric field distribution across the semiconductive element in the diode shown in FIG. 1.

In operation, a D-C voltage of the polarity shown is maintained between cathode and anode zones 12 and 16 to provide an electric field distribution across the wafer of the form shown in FIG. 2.

As seen in FIG. 2, the electric field is low across the cathode and anode zones, since each is of low resistivity material, rises abruptly at the reverse-biased junction between zones 12 and 13, maintains a substantially uniform high value throughout high resistivity zone 13, decreases from this high value to an intermediate value gradually through moderate resistivity zone 14, maintains this intermediate value essentially constant through high resistivity zone 15, and drops to a low value at the junction with the anode zone 16. Avalanching occurs in that region of the wafer where the electric field exceeds the critical avalanching value which for the dimensions of interest here is about $3.5 \times 10^5$ volts/cm. for silicon. The avalanche region consists essentially of zone 13 and a fraction of zone 14, and advantageously is from 15 to 40 percent of the distance between the cathode and anode zones. The remainder of zone 14 and zone 15 serve as the drift region and the electric field in such region is adjusted to be sufficient to insure that the electrons introduced therein from the avalanching region move with essentially a scattering limited velocity, which in the case of silicon means an electric field in excess of 20,000 volts/cm.

The roles of the various zones may be described as follows.

The low resistivity n-type anode zone 16 bridges one end of the active region to one of the two ohmic connections. In this capacity, it serves as a region for terminating the electric field and the space charge layer. It also acts to collect the electrons generated in the avalanche region.

The relatively high resistivity I-type zone 15 serves as the primary source of the delay or transit time necessary to this class of negative resistance device.

The relatively moderate resistivity n-type zone 14 serves as a region where the electric field is controllably reduced from the high value where avalanching stops but which is still at least at a value characteristic of scattering limiting velocity for the carriers. Where the field falls below the threshold for avalanching marks the end of the avalanche region and the start of the drift region.

The high resistivity zone 13 serves to fix the principal region of avalanching. Its thickness largely determines what current will flow under oscillating conditions. If too thin, avalanching occurs too soon in the cycle to permit high efficiencies. Also the oscillations tend to be noisy. If too thick, oscillating conditions occur at such high currents that overheating tends to occur with consequent damage to the wafer. As previously indicated, a satisfactory compromise appears to result by choosing an avalanche region of about fifteen to about forty percent of the total width of the active region.

The thicknesses of the two terminal regions 12 and 16 are not critical and are selected for convenience of fabrication.

A device of the kind described may be fabricated by known fabrication techniques essentially as follows. One starts with a crystal of low resistivity n-type material suitable for use as the anode and on this is grown by epitaxial techniques a layer of high resistivity material to form zone 15. In the course of the epitaxial growth process, a donor is added to the gas stream flowed past the crystal for growing temporarily lower resistivity n-type material to serve as zone 14 and then such addition is discontinued for continued growth of high resistivity material to serve as zone 13. Thereafter, an acceptor is diffused into the high resistivity epitaxial region to form therein a low resistivity p-type layer for serving as the cathode 12. In the course of this diffusion, donors will also tend to diffuse out of the doped material into the contiguous high resistivity material to decrease its resistivity. As a matter of fact, the resulting impurity doping profile in layer 15 seems advantageous to minimize burnout.

In a typical design for use at frequencies between 8 and 12 gigacycles, the zones 12 through 16 will have substantially the following thicknesses, recognizing however that the lines of demarcation between zones is not necessarily sharp, 0.5 micron, 1.0 micron, 0.5 micron, 3 microns and 5 mils.

Alternatively, the desired element may be fabricated essentially entirely by epitaxial techniques, each of layers 12, 13, 14 and 15 being grown epitaxially of desired doping and thickness. In this case, it may be desirable to provide an impurity doping profile directly during the growth of layer 14 to minimize burnout problems.

Of course, still other techniques can be employed for the preparation of a wafer having the characteristics described.

It will generally be advantageous that the zone 15 be wider than zone 13, which in turn be wider than zone 14, to realize an avalanche region which is between 15 and 40 percent of the total active region, as is preferred for practice of the invention. As previously indicated, the width of zones 12 and 16 are relatively immaterial. In the design described, zone 16 is made relatively thick to provide enough bulk to the wafer to facilitate handling. It is also to be recognized that the lines of demarcation between what constitutes N, and I material also is not very sharp and so this designation has more relevance as a measure of relative resistivity values (at least an order of magnitude) than as an absolute measure. In particular, it is to be recognized that it is virtually impossible to achieve truly intrinsic material and that by "I" material there is meant to be included material in which there may be an excess of either donor or acceptor impurities.

Figure 1A:
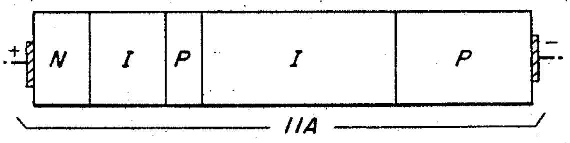

Moreover, while the invention hitherto has been described with specific reference to a PININ configuration, which is preferred for use with silicon because of the superior mobility characteristics of electrons in silicon, the complementary NIPIP configuration shown as element 11A in FIG. 1A is also feasible, requiring simply a reversal of polarities of the applied voltage, and it is possible that with other semiconductive materials such configuration may prove superior. Of course, it is feasible to employ semiconductive materials other than silicon.

Figure 3:
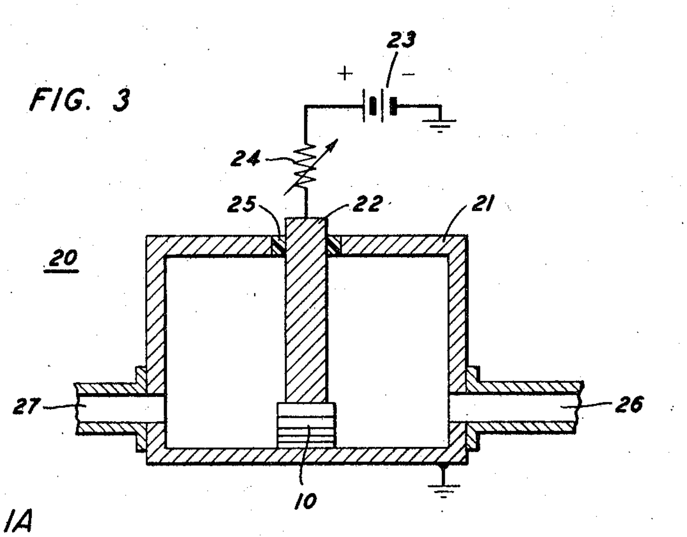
FIG. 3 shows a microwave oscillator utilizing the diode shown in FIG. 1 in accordance with the preferred embodiment of the invention.

FIG. 3 depicts schematically the basic elements of an oscillator 20 employing a negative resistance diode. Except for the difference in the form of negative resistance diode, the basic arrangement is well known. The negative resistance diode 10 of the kind shown in FIG. 1 is housed in a cavity such that the assembly is resonant at the desired operating frequency. Of course, it is important that the diode exhibit a dynamic negative resistance at such frequency and so it should be dimensioned appropriately. The diode is positioned between the conductive post 22 and the wall of the guide whereby there results a path for D-C currents which includes the D-C voltage source 23, the variable resistor 24, conductive post 22, the diode 10 and the wall of the guide 21 which is connected to ground. To maintain D-C isolation between the guide wall and the post, with little effect on A-C currents, an insulating bushing 25 is provided where the post passes through the guide. An output iris 26 permits abstraction from the cavity of oscillatory power for utilization.

In some instances, for example where the outputs of a number of oscillators are to be combined cumulatively to increase the total power output, it may be desirable to inject a small amount of control power at the desired operating frequency to lock the oscillations in frequency and phase to such control power. To this end, there is shown an iris 27 by way of which such control power may be injected if desired. Of course iris 26 can simultaneously function as both an output iris and an injection iris provided appropriate external circuitry is supplied.

Voltage tuning is achieved by means of the variable resistor 24. Additionally, if found desirable, provision can be made for tuning the cavity by mechanical means in known fashion, or by the inclusion of additional electronic tuning mechanisms such as varactors.

The basic arrangement described is also amenable for use as an amplifier. In this case, iris 27 serves as a means by which the input signal to be amplified is introduced into the cavity and the iris 26 serves to abstract the amplified signal. Alternatively, the amplifier may employ only a single port, use being made of a circulator in the manner known to workers in the art to separate input and output signals. For use as an amplifier, the circuit shown, 20, must be appropriately readjusted to load the negative resistance of the diode sufficiently to suppress oscillations.

Accordingly, it is to be understood that the specific embodiments described are merely illustrative of the principles of the invention and that various other arrangements may be devised without departing from the spirit and scope of the invention.

It is of course consistent with the invention to include an impact ionization transit time diode of the kind described as one part of an integrated circuit arrangement.

What is claimed is:

1. An impact ionization transit time diode comprising a semiconductive wafer having either a PININ or NIPIP configuration and only two electrode connections, one to each of the two end zones of said wafer.

2. A diode in accordance with claim 1 in which the second zone is wider than the third zone and narrower than the fourth zone.

3. In combination:

an impact ionization transit time diode capable of providing a dynamic negative resistance over an operating frequency range comprising
- a semiconductive wafer comprising five successive zones of differing resistivities as follows
- a first zone of relatively low resistivity of a first conductivity type,
- a second zone of relatively high resistivity,
- a third zone of relatively moderate resistivity of the conductivity type opposite that of the first zone,
- a fourth zone of relatively high resistivity and
- a fifth zone of relatively low resistivity of the conductivity type of the third zone;

a cavity housing said diode, the first and fifth zones of the diode making electrical connection to opposed surfaces of the cavity, the assembly being resonant in said operating frequency range, and means for supplying power to said diode for maintaining a voltage difference between the first and fifth zones and for establishing a dynamic negative resistance in said diode.

4. The combination of claim 3 in which the second zone of the wafer is wider than the third zone and narrower than the fourth zone.

5. The combination of claim 3 in which the wafer has either a PININ or an NIPIP configuration.

6. An amplifier in accordance with the combination of claim 1 in combination with means for applying to said cavity input power to be amplified and abstracting from said cavity amplifier output power.

References Cited

UNITED STATES PATENTS 3,192,398 6/1965 Benedict ----------- 317—235

JOHN KOMINSKI, *Primary Examiner.*

U.S. Cl. X.R.

317—235; 307—318, 324; 330—34, 37; 331—96